(12) United States Patent
Lin

(10) Patent No.: US 7,944,217 B2
(45) Date of Patent: May 17, 2011

(54) OBJECT PROXIMITY DETECTOR AND OBJECT POSITION DETECTOR

(75) Inventor: Shyuh Der Lin, Hsinchu (TW)

(73) Assignee: Holylite Microelectronics Corp., Hsinchu (TW)

( * ) Notice: Subject to any disclaimer, the term of this patent is extended or adjusted under 35 U.S.C. 154(b) by 326 days.

(21) Appl. No.: 12/382,088

(22) Filed: Mar. 9, 2009

(65) Prior Publication Data

US 2010/0225336 A1  Sep. 9, 2010

(51) Int. Cl.
*G01R 27/26* (2006.01)
*H03B 5/32* (2006.01)

(52) U.S. Cl. ............ 324/681; 324/662; 324/76.48; 331/158; 331/165; 331/135; 331/57; 331/116 R

(58) Field of Classification Search ............ 324/661, 324/662, 681, 686; 331/158, 135, 57, 116 R, 331/116 FE, 165
See application file for complete search history.

(56) References Cited

U.S. PATENT DOCUMENTS 7,023,221 B1 * 4/2006 Lin ................ 324/662

\* cited by examiner

*Primary Examiner* — Ha Tran T Nguyen
*Assistant Examiner* — Alesa Allgood
(74) *Attorney, Agent, or Firm* — Bacon & Thomas, PLLC

(57) ABSTRACT

The present invention offers an object proximity detector and object position detector. The variation of frequency of an oscillator is used to detect the proximity of an object to a sensor plate. The dependence of the sensitivity of the detector on the area of the sensor plate is reduced by conducting the sensor plate to two capacitors in series. The conducting wire of the sensor plate can be flexible without causing error detection. In the sensor element of the sensor oscillator, a resistor is connected at one terminal of the sensor plate to form a high pass filter. A resistor and a capacitor are added to the sensor oscillator to form a low pass filter. The high pass filter is used to reduce the low frequency electromagnetic interference. The low pass filter is used to reduce the high frequency electromagnetic interference.

8 Claims, 15 Drawing Sheets

OBJECT PROXIMITY DETECTOR AND OBJECT POSITION DETECTOR

BACKGROUND OF THE INVENTION

1. Field of the Invention

The present invention relates to an object proximity detector. In particular, the present invention relates to an object proximity detector or position detector with reduced interference of external electrical and magnetic wave.

2. Description of the Related Art

The capacitive sensing technology is popular in the design of object proximity detector and position detector. The capacitances of capacitor and sensor plate used in the sensor circuit are very small. Small capacitance means high impedance and bad noise immunity. But in many applications, immunity from the electromagnetic interference is very important. There is a variety of technologies to design object proximity detector and object position detector. One of the technologies is to feed an AC signal to an amplifier through a capacitor and a sensor plate and to measure the variation of amplitude of the AC signal at the output of the amplifier. The technology is used in U.S. Pat. No. 5,374,787, U.S. Pat. No. 5,495,077, U.S. Pat. No. 5,841,078, to Robert J. Miller et al., U.S. Pat. No. 5,914,465, U.S. Pat. No. 6,239,389B1, to Timothy P. Allen et al., U.S. Pat. No. 6,028,271, U.S. Pat. No. 6,610,936B2, to David W. Gillespie et al. In these systems, the immunity of electromagnetic interference from sensor plate is seldom mentioned. The technology used in U.S. Pat. No. 6,452,514B1 and U.S. Pat. No. 6,466,036 B1, to Harald Philipp is a charge transfer circuit. In this circuit, an AC voltage source is applied to one plate of the sensor and fed into a signal processor through the other plate of the sensor. The charge transfer circuit is used to reduce the influence of the noise. The signal processor consists of charge transfer circuit, integrator and voltage measurement circuit. Besides the analog circuits mentioned above, a lot of high speed switches are used. The clock feed-through caused by the parasitic capacitance of the high speed analog switches will cause another interference of noise and distortion of the signal. One of the capacitive object proximity detector and position detector was designed by the inventor as described in the U.S. patent (U.S. Pat. No. 7,023,221, B1), European patent (EP 1791260 B1) and Taiwan, R.O.C. patent (I 259908). The basic circuit of the invention is illustrated in FIG. 1. FIG. 1 is an oscillator circuit of an object proximity detector with a single pair of sensor plates. This circuit consists of three inverters, 101, 102, 103, a resistor 104, two capacitors, 106, 107 and a pair of sensor plates (105) with capacitance Cs. The frequency of the oscillator is determined by the resistance of the resistor 104 and capacitance of capacitor 106, 107 and sensor plates 105. The proximity of an object to the sensor plates 105 will change the capacitance of the sensor plates, and the frequency of the oscillator. The proximity of an object to the sensor plates will be detected by the variation of the frequency of the oscillator. There are two advantages of the object proximity detector. Independence of the sensitivity of the object proximity detector with process parameters variation is one of the advantages. The other advantage is the high sensitivity of the object proximity detector.

The sensor plates of FIG. 1 are in the feedback loop of the oscillator and outside of the integrated circuit. The capacitance of the sensor plates will affect the frequency of the oscillator significantly. Besides, if the area of the sensor plates is big enough, the external electrical and magnetic interference will affect the performance of the oscillator significantly. FIG. 2 is an oscillator of object proximity detector with two pairs of sensor plates which can detect the proximity of an object at two different positions. Both pairs of sensor plates 205 and 206 are at the feedback loop of the oscillator and in series with transmission gates 208 and 209 respectively. Only one of the transmission gates is conducting at one time. In some application, it is necessary to design a system with different area of sensor plates. Different area of sensor plates causes different capacitance. And the frequency of the oscillator will be different when switch to different transmission gate. If the difference of the frequency is big enough, it is difficult to set the sensitivity of the proximity detector in a system. Therefore it is one of the objects of the invention to design a proximity detector to reduce the dependence of the frequency on the area of the sensor plates. In the circuit of the prior art, as shown in FIG. 1, there are two connecting wires 108 and 109 connecting the sensor plates 105 to the oscillator circuit 100. In FIG. 1, if the connecting wires are very long, the capacitance between the two wires has considerable effect on the frequency of the oscillator. Besides, if the two connecting wires are flexible, the variation of the distance between the two wires will cause the variation of the capacitance between the two wires. Variation of the capacitance will cause variation of the frequency and error detection of the object proximity detector. Therefore it is another object of the invention is to design a proximity detector to reduce the effect of the capacitance between the two conducting wires on the frequency of the oscillator. The other object of the invention is to design a proximity detector to reduce the influence of the external electrical and magnetic interference. In the design of the circuit of invention, we keep the compensating capacitor which is also used in the circuit of the prior invention, and the dependence of oscillator frequency on the process parameters can be kept to a minimum. Besides, the sensor plate and two capacitors which connecting the sensor plates are also in the feedback loop of the oscillator, and high sensitivity of the object proximity can be kept. In summary, in designing an object proximity detector and object position detector, we want not only to keep the advantages of the prior art of invention but also to improve the immunity of electromagnetic interference, the independence of sensitivity on sensor plate area and to allow the flexibility of conducting wire of the sensor plate.

OBJECTS OF THE INVENTION

Therefore, it is an object of the present invention to provide an object proximity detector to reduce the interference of external electrical and magnetic wave.

It is another object of the invention to provide an object proximity detector such that the conducting wire of the sensor plate has little effect on the frequency of the sensor oscillator.

It is yet another object of the invention to provide a position detector to reduce the interference of external electrical and magnetic wave.

It is yet a further object of the invention to provide a position detector such that the conducting wire of the sensor plates has little effect on the frequency of the sensor oscillator.

It is yet a further object of the invention to provide a position detector such that the area of each sensor plates has little effect on the sensitivity of the position detector.

DISCLOSURE OF THE INVENTION

A first aspect of the present invention teaches an oscillator circuit of an object proximity detector or an object position detector. In the oscillator circuit, two capacitors are connected in series. Further these two capacitors are connected in parallel with the charging resistor. Both capacitors and the resistor are in the feedback loop of the oscillator. A sensor plate is connected at the junction of the two capacitors in series. The capacitors, resistor and the oscillator can be embedded in an integrated circuit to immune from the external electromagnetic interference. A finger or an object can be placed in the vicinity of the sensor plate. The capacitance between the sensor plate and the ground will be changed by the vicinity of the finger or the object. And the frequency of the oscillator will be changed by the variation of the capacitance. The output of the oscillator is connected to a microprocessor. By the variation of the frequency of the oscillator, the proximity of a finger or an object can be detected by the microprocessor.

When there is not object or finger in the vicinity of the sensor plate, the capacitance between the sensor plate and ground is very small as compare to the capacitance of the embedded capacitors in the integrated circuit. And area of the sensor plate has only little effect on the free running frequency of the oscillator. The sensitivity of the object proximity detector depends primarily on the variation of capacitance between the sensor plate and object, but not directly on the area of the sensor plate.

For two objects with different area, the capacitance between two objects primarily depends on the object with small area. For a sensor plate with the area much bigger than that of a finger tip, the sensitivity of the proximity detector primarily depends on the distance between the sensor plate and the finger tip but only secondarily depends on the area of the sensor plate. In the design of an object proximity detector, it is not necessarily to take the area of the sensor plate too much consideration in the determination of sensitivity setting.

There is only one sensor plate in the object proximity detector and only one conducting wire connected to the sensor plate. Keep away the conducting wire from the circuit, the capacitance between the conducting wire and ground will be kept to a minimum, and the conducting wire has little effect on the frequency of sensor oscillator. The conducting wire can be flexible and has very low possibility to cause error detection of the object proximity detector.

The technology of the invention can also be applied to an object position detector. An object position detector is object proximity detector with multiple sensor plates. By using the technology of invention, different size of sensor plate can be used in the object position detector.

The second aspect of the present invention teaches an oscillator circuit of an object proximity detector or an object position detector. In this circuit the technology of the invention is used to minimize the interference of external electrical and magnetic wave. For the low frequency electromagnetic wave, a CR high pass filter is used. At the terminal of sensor plate, a resistor is connected to the ground. When a finger closes the sensor plate, a capacitor is form between the finger and the sensor plate. The capacitor and resistor will perform the function of the high pass filter. The low frequency noise induced at the finger will be reduced by this high pass filter. In order to reduce the high frequency interference, a capacitor and a resistor are added in the feedback path.

BRIEF DESCRIPTION OF THE DRAWINGS

The foregoing and other advantages of the invention will be more fully understood with reference to the description of the best embodiment and the drawing wherein.

DESCRIPTION OF THE PREFERRED EMBODIMENTS

Figure 1:
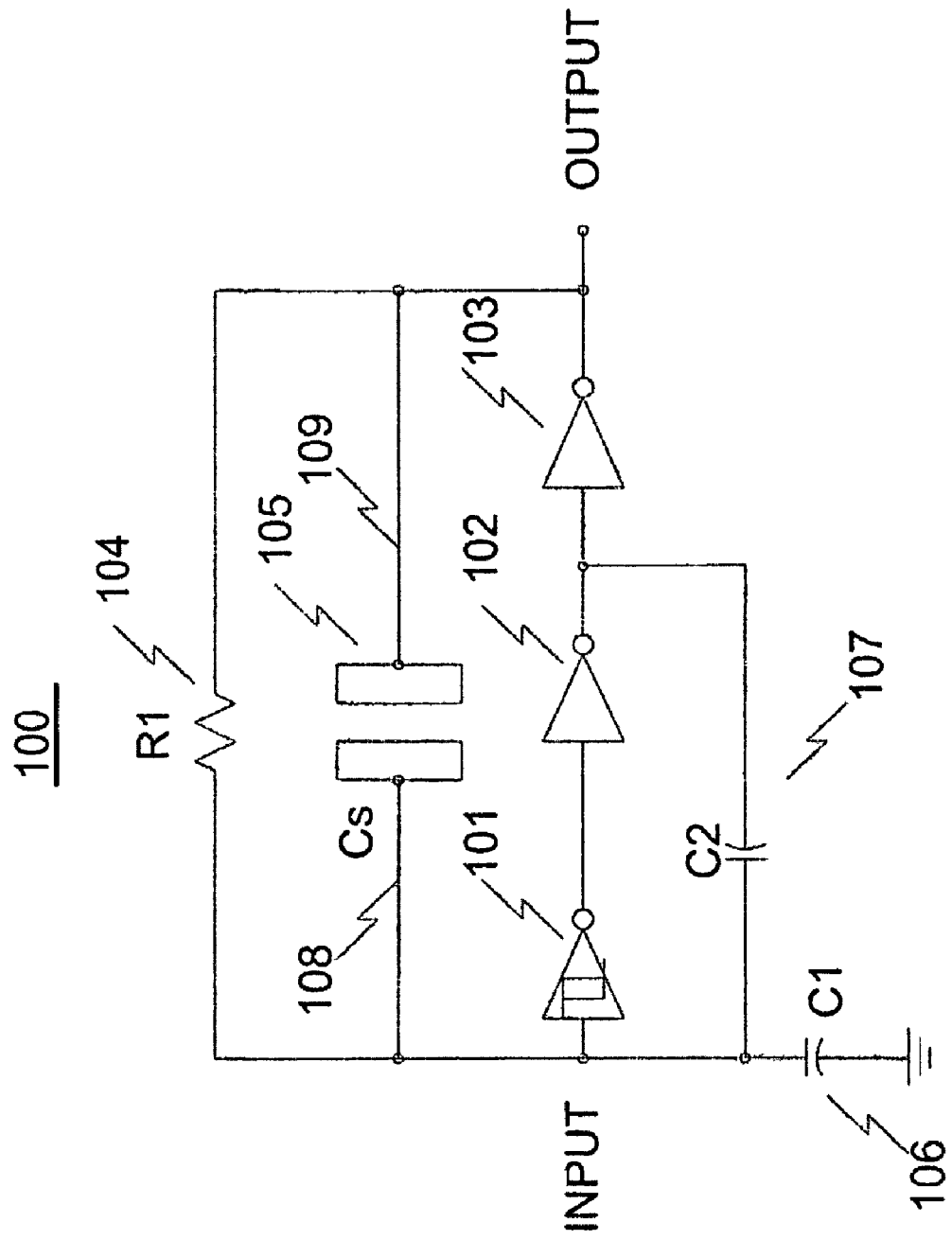
FIG. 1 is an oscillator circuit of an object proximity detector with a single pair of sensor plates.
Figure 2:
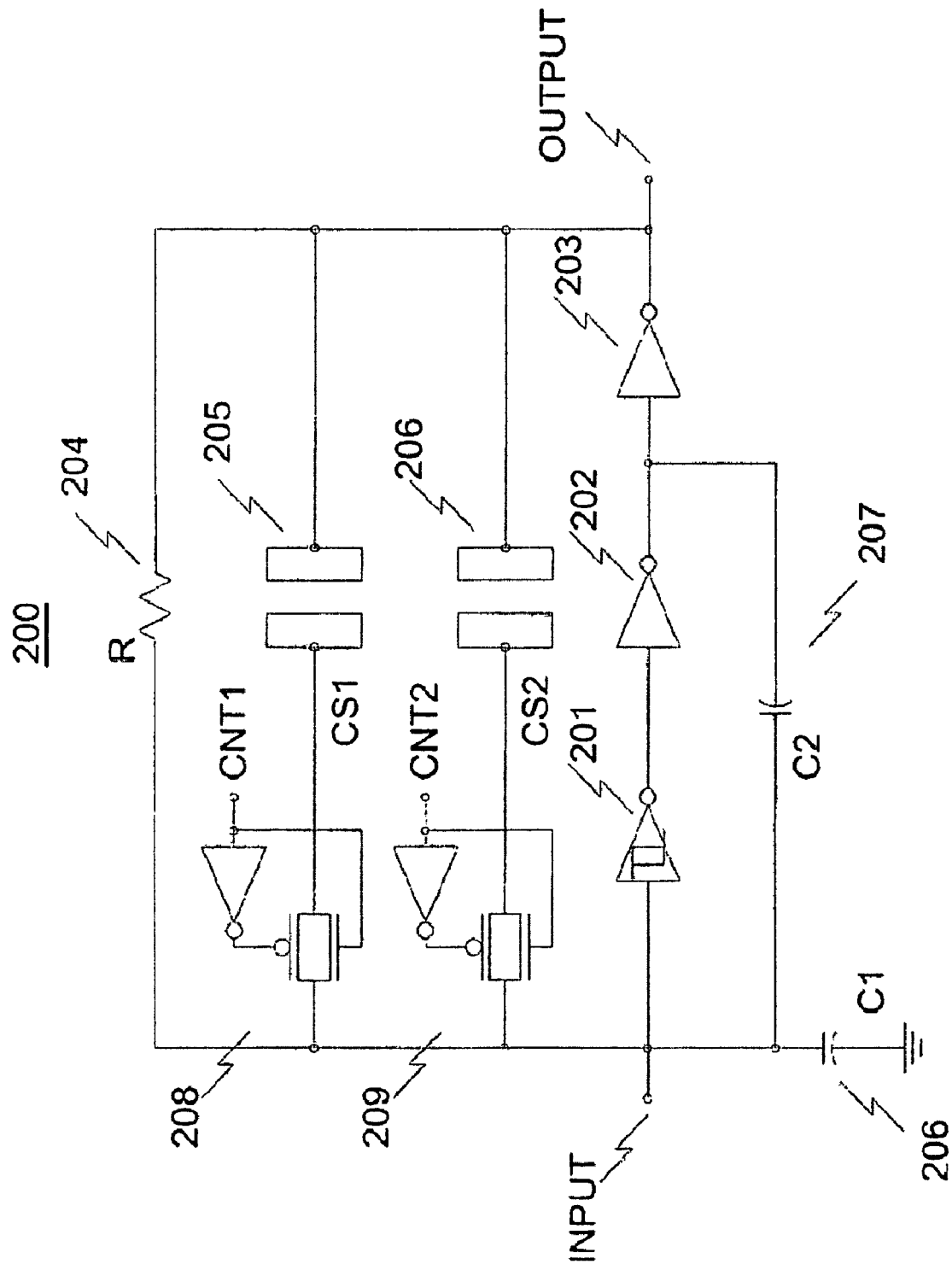
FIG. 2 is an oscillator circuit of an object proximity detector with two pairs of sensor plates.
Figure 3:
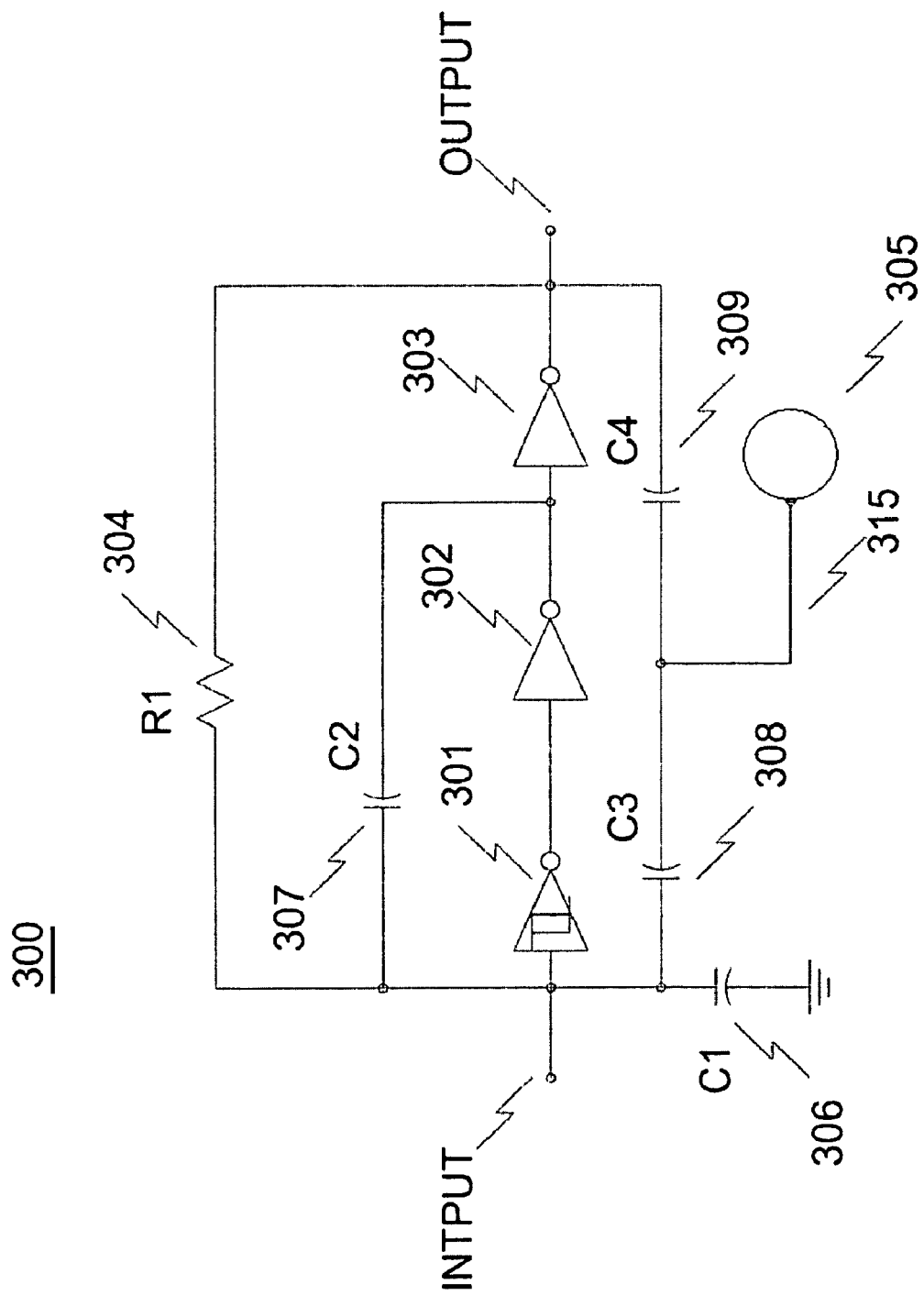
FIG. 3 is a sensor oscillator circuit of the present invention with the less dependence of the frequency on the size of the sensor plate.

One embodiment of an object proximity detector of the present invention consists of at least a sensor plate, a sensor oscillator, a time base oscillator, a counter and a microprocessor. In most of application, different size of sensor plate may be used in different kind of application. In most application of the object proximity detector, free running frequency of the sensor oscillator must be independent of the size of the sensor plate. FIG. 3 is a sensor oscillator circuit of the present invention with the less dependence of the frequency on the size of the sensor plate. As shown in FIG. 3, the oscillator consists of three inverters, a first inverter 301, a second inverter 302 and a third inverter 303 are in cascaded; a capacitor 306 is connected between the input of the inverter 301 and the ground; a resistor 304 is connected between the input of the inverter 301 and the output of the inverter 303; a compensating capacitor 307 is connected between the input of the inverter 301 and the output of the inverter 302; two series capacitors 308 and 309 are connected between the input of the inverter 301 and the output of the inverter 303; a sensor plate 305 is connected at the junction of the capacitors 308 and 309. The feedback resistor 304 is used to charge and discharge the capacitors 306, 307, 308 and 309 and capacitor of the sensor plate 305. The compensating capacitor 307 is used to reduce the dependence of oscillator frequency on process parameters. If the sensor plate 305 is far apart from the ground of the circuit and if the size of the sensor plate is small, the capacitance between the sensor plate and ground is small as compare to the capacitors 306, 307, 308 and 309. If the capacitance between the sensor plate and ground is much small than the capacitance of capacitors 308 and 309, the size of the sensor plate has only little effect on the frequency of the oscillator. Similarly, keep the conducting wire 315 far from the ground of the circuit, the capacitance between the conducting wire and ground is much small than that of capacitors 308 and 309. In this situation the effect of the conducting wire on the frequency of sensor oscillator is small, and the conducting wire can be flexible without cause error detection of the object proximity detector.

Figure 4:
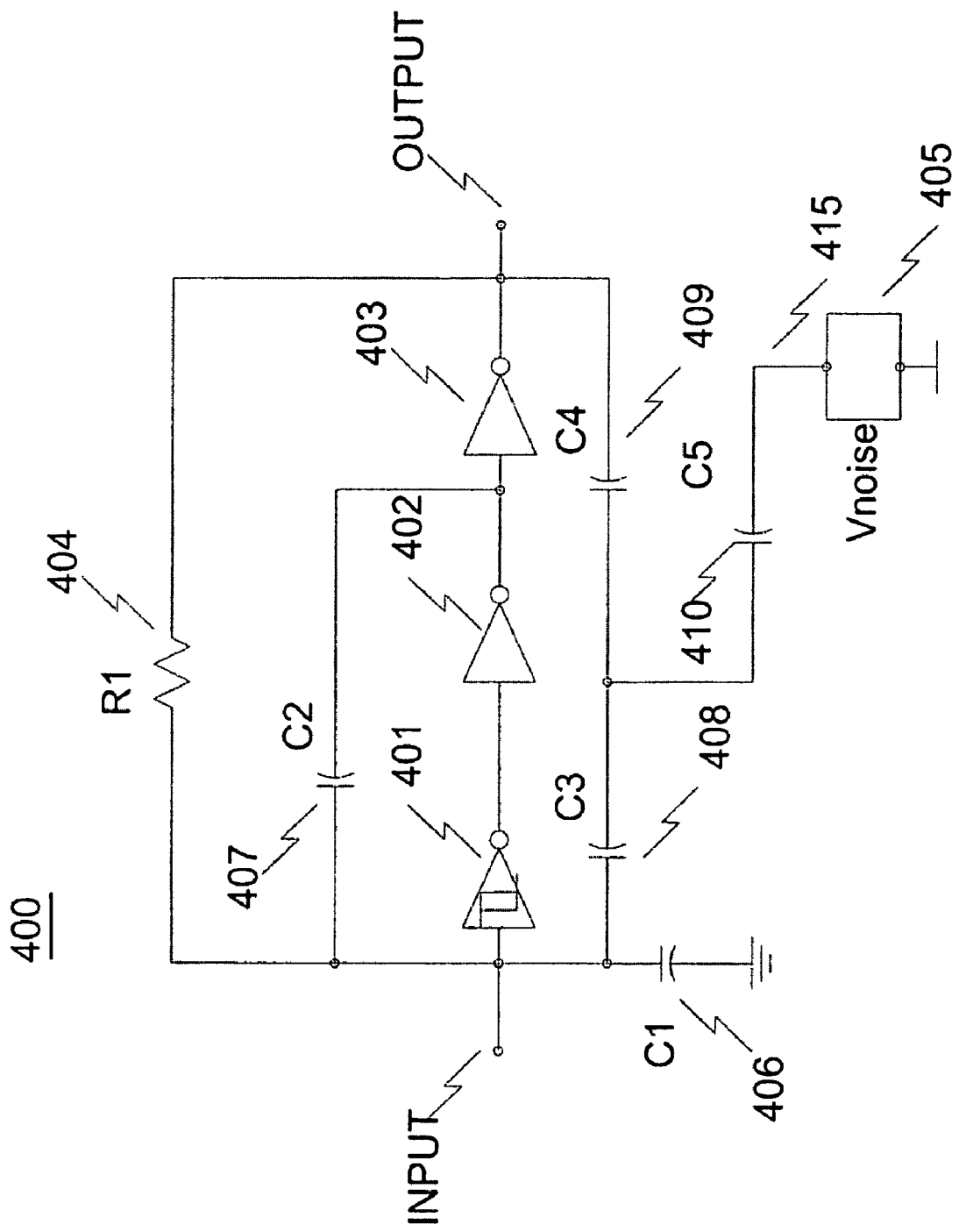
FIG. 4 is an equivalent circuit of the oscillator in FIG. 3. This circuit describes the influence of the electric and magnetic interference.

When a finger is in the vicinity of the sensor plate of an object proximity detector, the electric and magnetic wave induced in a human body will be transferred to the sensor plate and causes interference. The frequency of the oscillator of the object proximity detector will be disturbed. The equivalent circuit of the oscillator describes the influence of the electric and magnetic interference is shown in FIG. 4. In FIG. 4, the interference of electric and magnetic wave transferred from a finger is represented by a noise generator 405. The capacitor 410 is the capacitor between the sensor plate and the finger. There are two major types of noise encountered in most application of object proximity detector. The electric and magnetic interference from the 60/50 hertz electrical power line is one kind of low frequency noise. The other kind of electric and magnetic interference is the high frequency noise generates from the switching power supply of the system.

Figure 5:
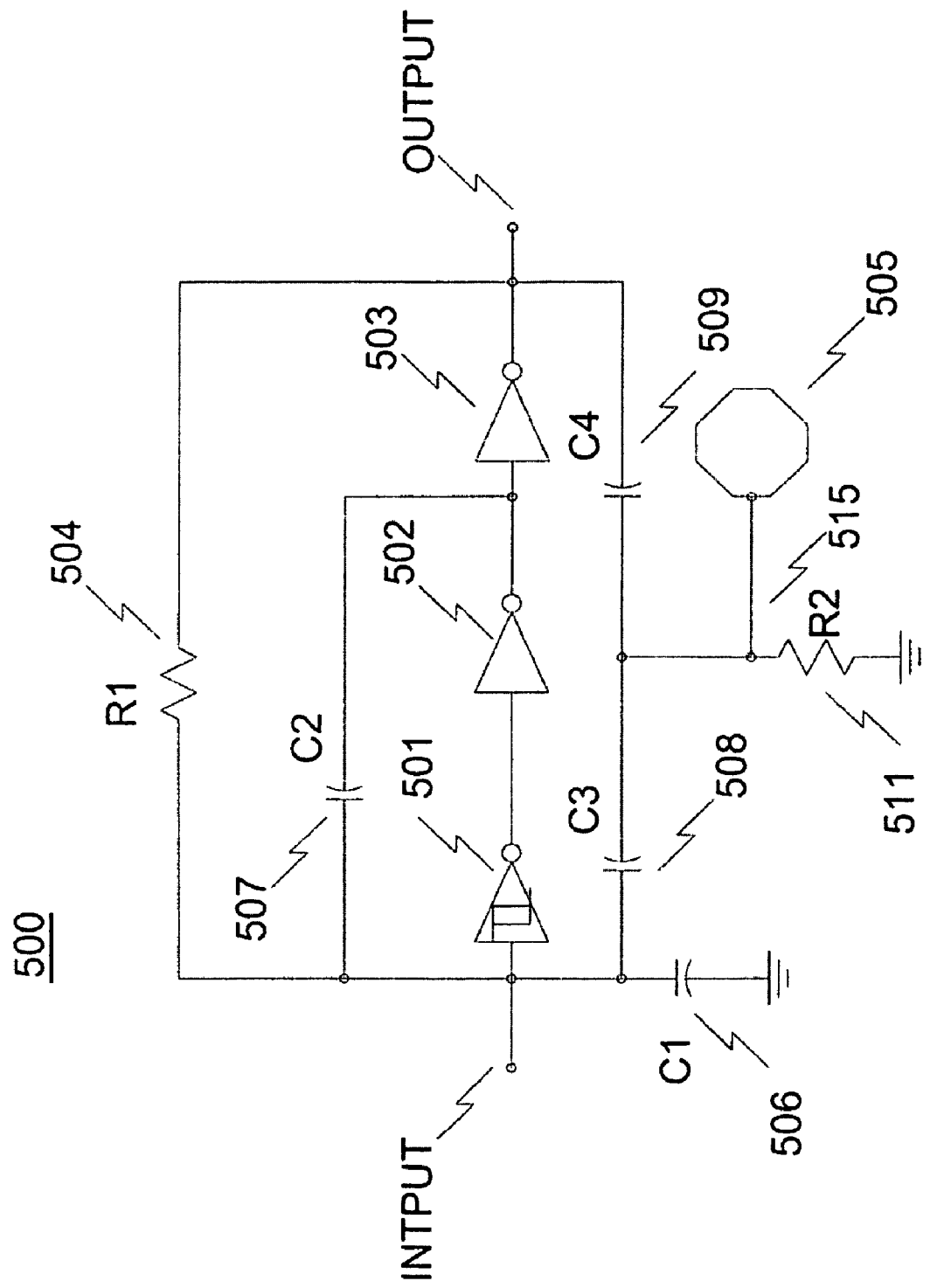
FIG. 5 is a sensor oscillator circuit with a high pass filter circuit consists of a CR circuit.
Figure 6:
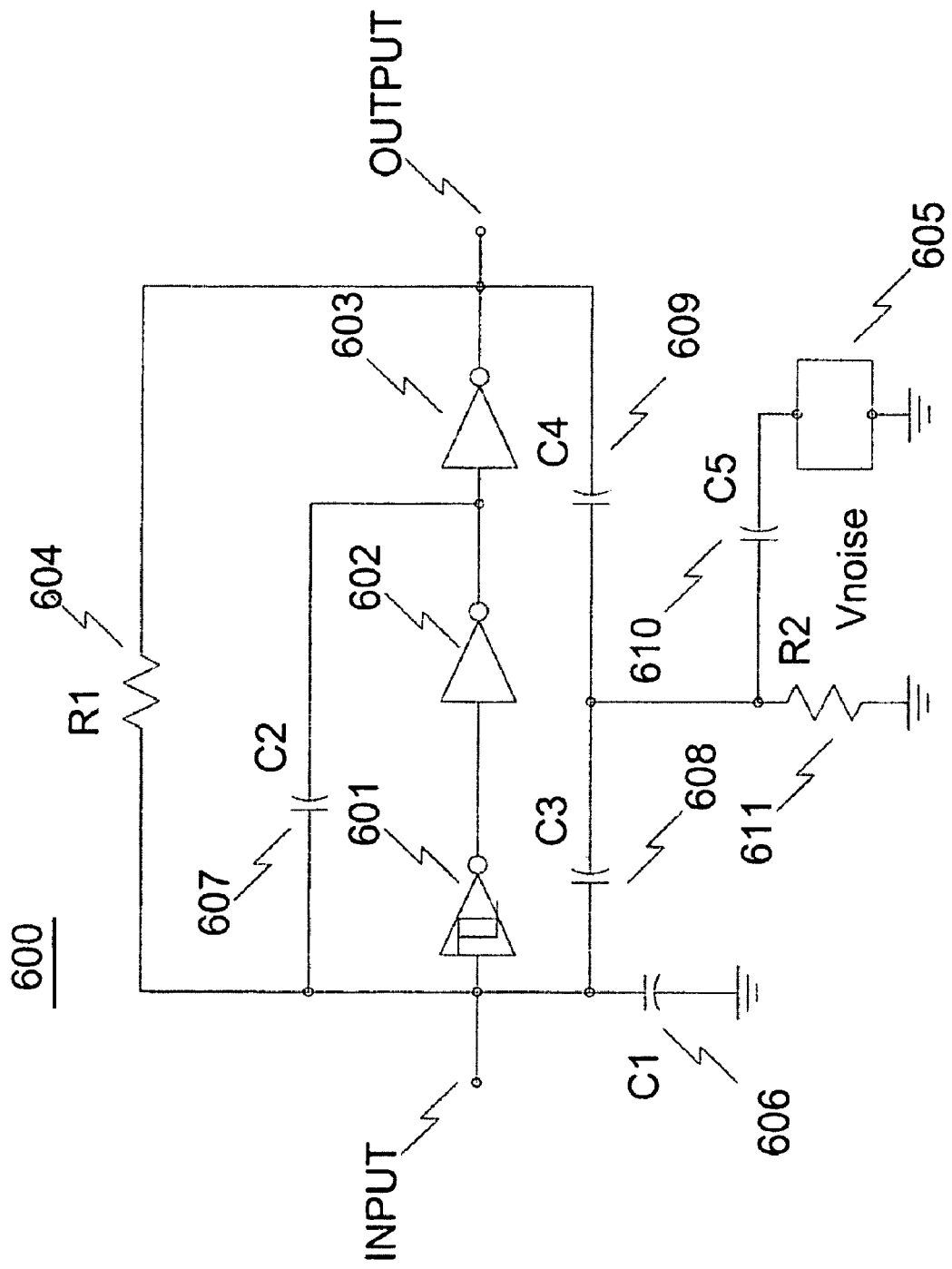
FIG. 6 is an equivalent circuit of the circuit in FIG. 5.

In order to reduce the low frequency interference of electric and magnetic wave, a high pass filter circuit is used. A high pass filter circuit consists of a CR circuit is shown in FIG. 5. In FIG. 5, a resistor 511 is connected at the terminal of the sensor plate. FIG. 6 is the equivalent circuit of the circuit in FIG. 5. In FIG. 6 the resistor 611 is the resistor connected at the terminal of sensor plate, capacitor 610 is the capacitor between the finger and the sensor plate. And the noise generator 605 is electric and magnetic interference transferred from the finger. The resistor 611 and capacitor 610 function as a high pass filter for the noise generator, and low frequency signal will be attenuated by the resistor 611 when pass through the capacitor 610.

Figure 7:
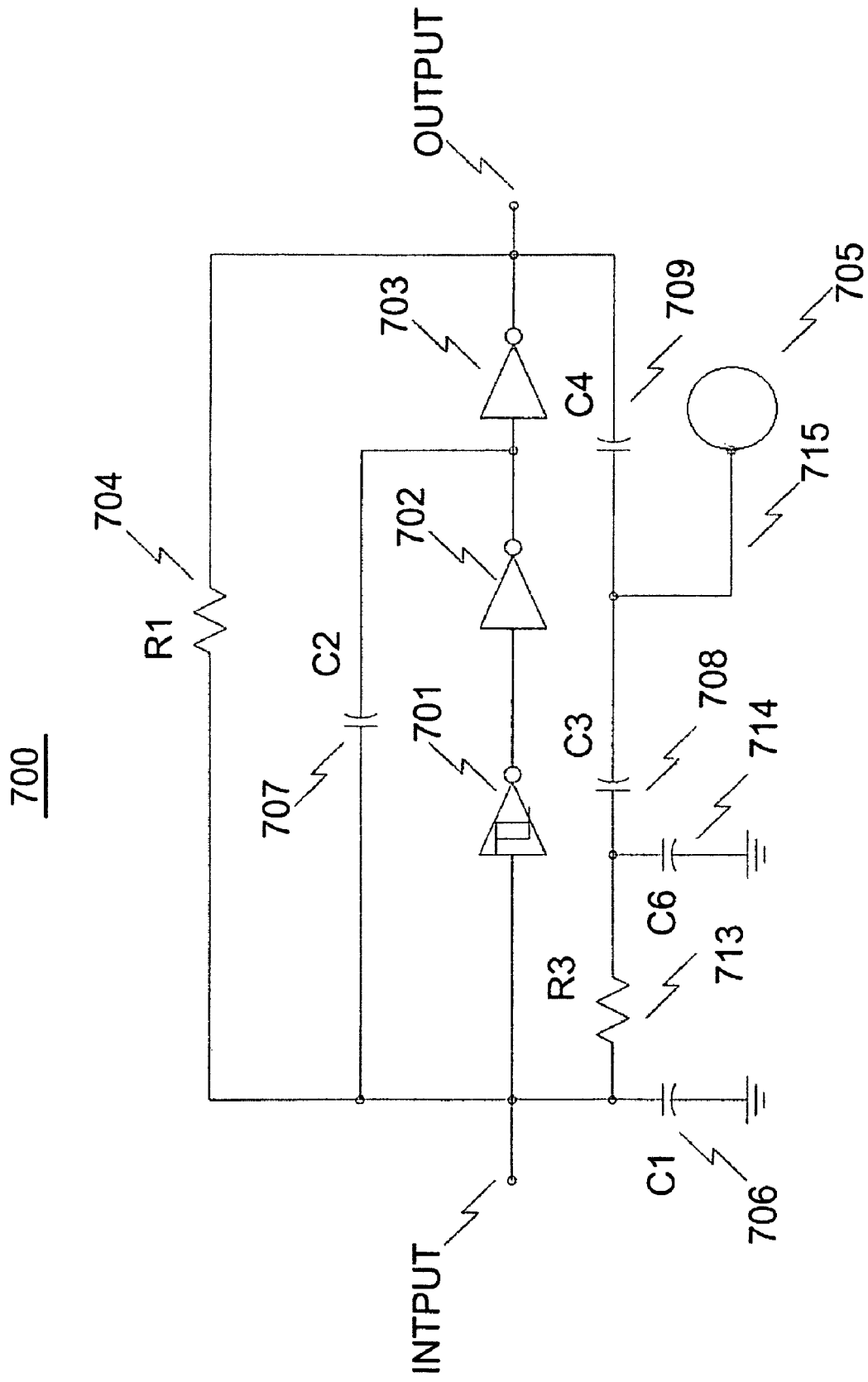
FIG. 7 is a sensor oscillator circuit with a voltage divider circuit and low pass circuit.
Figure 8:
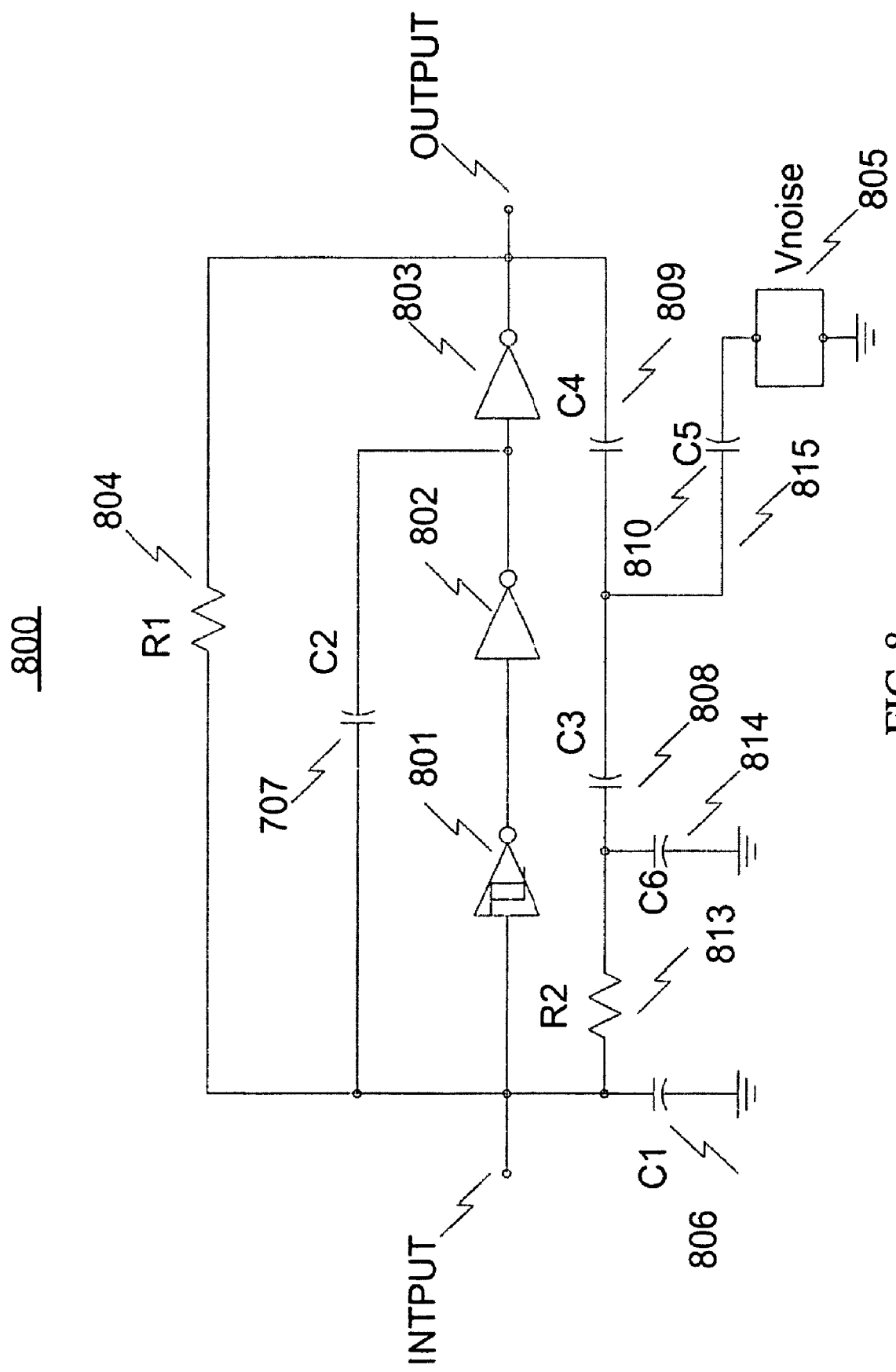
FIG. 8 is an equivalent circuit of the circuit in FIG. 7.

In order to reduce the high frequency interference of electric and magnetic wave, a low pass filter circuit is used. A circuit consists of a voltage divider circuit and low pass circuit is shown in FIG. 7. In FIG. 7 a capacitor 714 is added to perform a voltage divider. A resistor 713 and capacitor 706 are used to perform a low pass filter. The equivalent circuit of the circuit in FIG. 7 is shown in FIG. 8. In FIG. 8, the capacitor 810 is the capacitor between the finger and the sensor plate and the noise generator 805 is electric and magnetic interference transferred from the finger. The capacitance of capacitor 810 is small as compare to that of capacitors 808, 809 and 814. The high frequency noise will be attenuated by capacitor 814 when pass through capacitor 810 and capacitor 808. The high frequency noise will be further reduced by the low pass filter circuit form by resistor 813 and capacitor 806.

Figure 9:
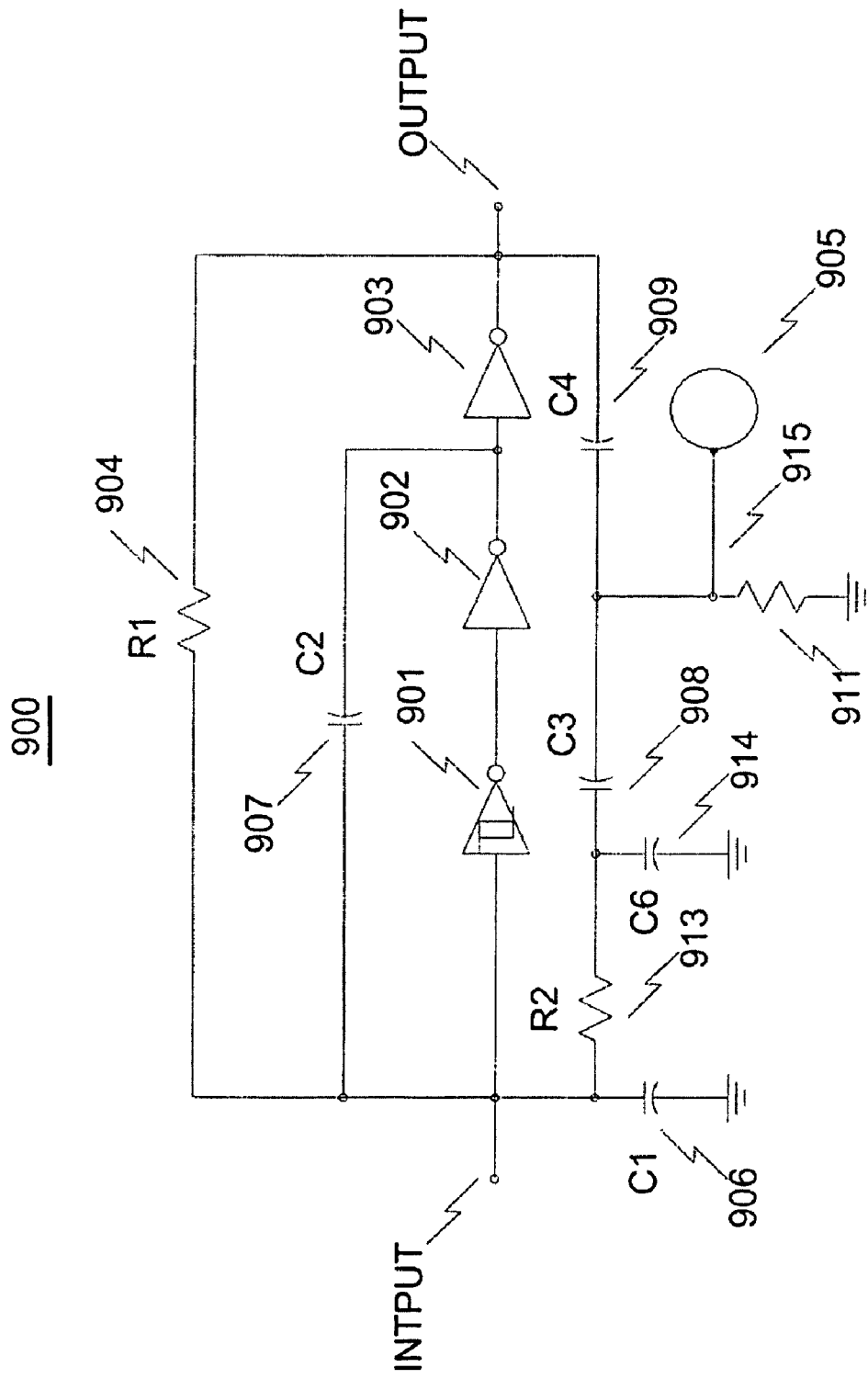
FIG. 9 is a sensor oscillator circuit used to reduce the high frequency and low frequency interference of electric and magnetic wave.

In some of applications, high frequency and low frequency interference of electric and magnetic wave exist at the same time. A circuit used to reduce the high frequency and low frequency interference of electric and magnetic wave is shown in FIG. 9. The circuit in FIG. 9 combines the advantages of the circuits in FIG. 5 and FIG. 7. There are high pass filter, voltage divider and low pass filter in circuit in FIG. 9.

Figure 10:
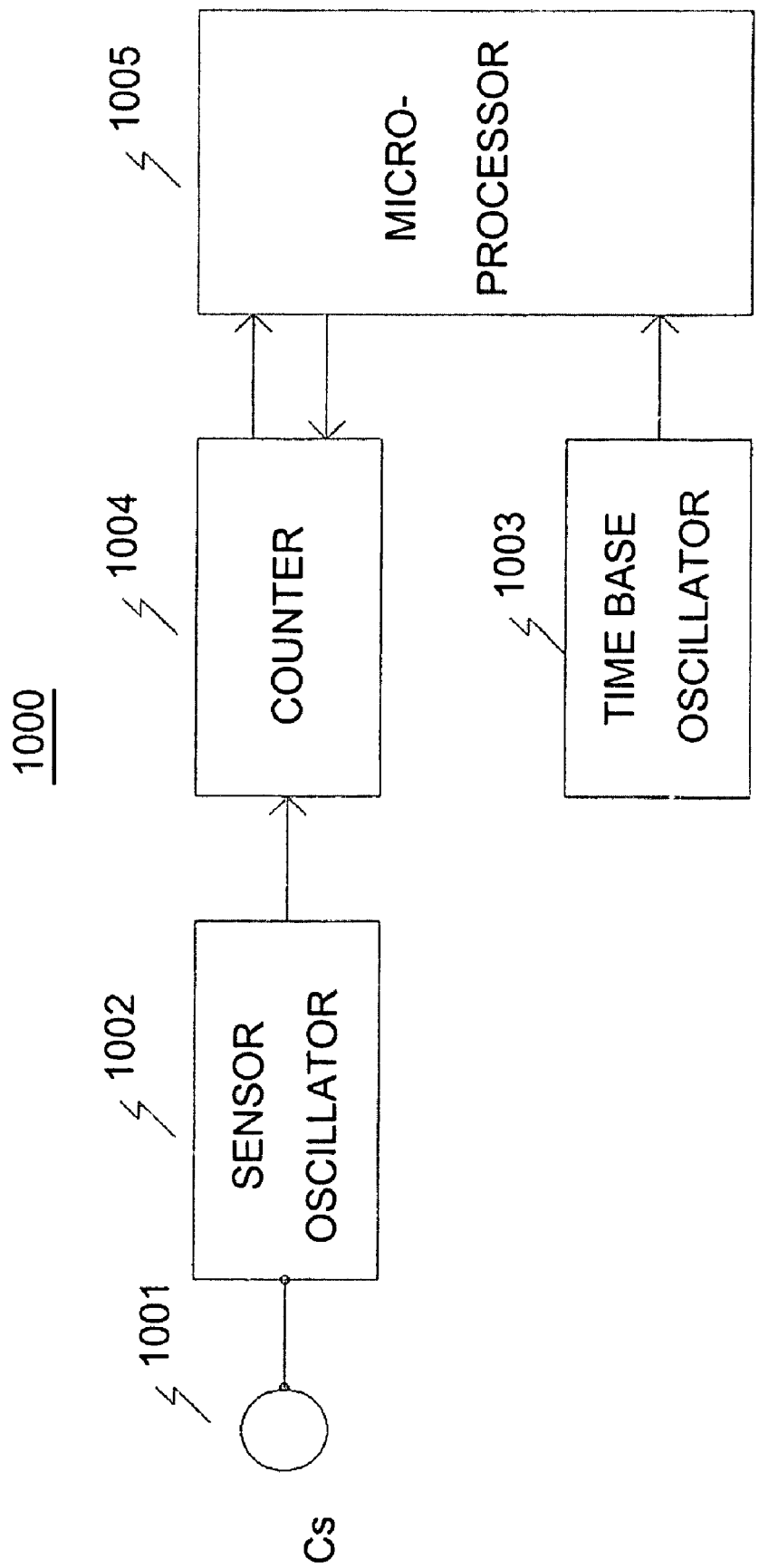
FIG. 10 illustrates an object proximity detector in according to one embodiment of the present invention.

The circuits of the present invention discussed above are oscillators used in object proximity detector or object position detector. An object proximity detector at least consists of a sensor plate, a sensor oscillator, a time base oscillator, a counter and a microprocessor. The system shown in FIG. 10 illustrates an object proximity detector in according to one embodiment of the present invention. In FIG. 10 the system consists of a sensor plate 1001 connected to a sensor oscillator 1002, a time base oscillator 1003, a counter 1004 and a microprocessor 1005. The sensor oscillator 1002 with the sensor plate 1001 is a circuit which is described in FIG. 3, FIG. 5, FIG. 7 and FIG. 9. The time base oscillator 1003 provides system clock to the microprocessor 1005. During the detection period of the system, a reference count (N0) is stored in the microprocessor 1005 and always updating. This reference count is defined as the counting number when there is not object in proximity of the sensor plate 1001. And the reference count is also the maximum count ever measured during the counting process. A predetermined number (Nr) can be input to the microprocessor 1005 and used to define the sensitivity of the object proximity detector. In order to detect the proximity of an object, the counter 1004 counts the frequency of the sensor oscillator. If the counting number for a definite period is Nx, N0−Nx can measure the proximity of an object to the sensor plate 1001. When (N0−Nx)>Nr is measured, we can determine that an object is in proximity to the sensor plate 1001. A smaller Nr means a more sensitive system. By input different Nr to the microprocessor 1005, the sensitivity of object proximity detector can be programmed externally.

The preceding method teaches us how to detect an object in proximity of a sensor plate. The technology can be expanded and modified to detect an object in proximity of an array of sensor plates, and to distinguish which sensor plate in the array is detected.

Figure 11:
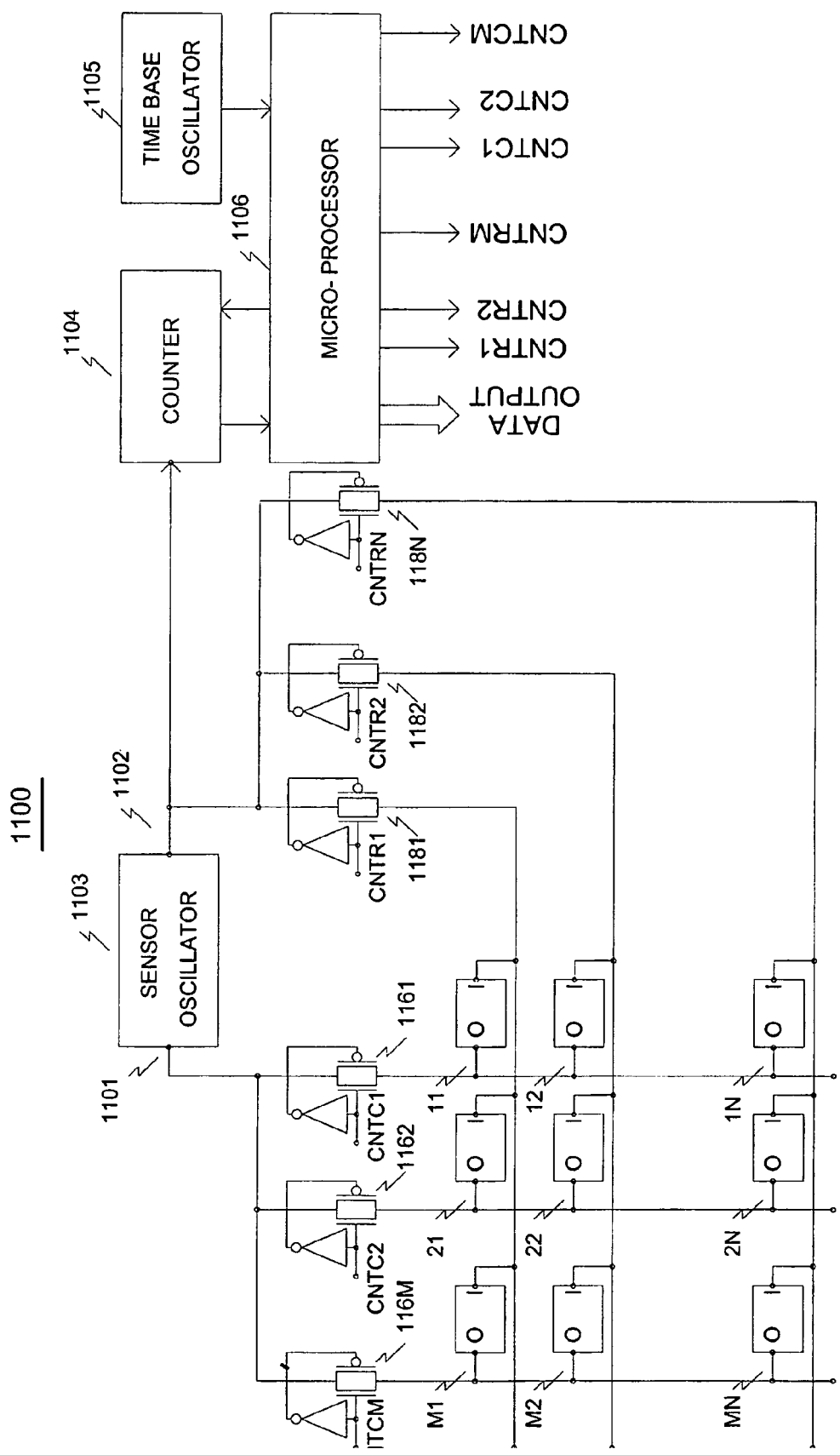
FIG. 11 is one embodiment of an object position detector.
Figure 12:
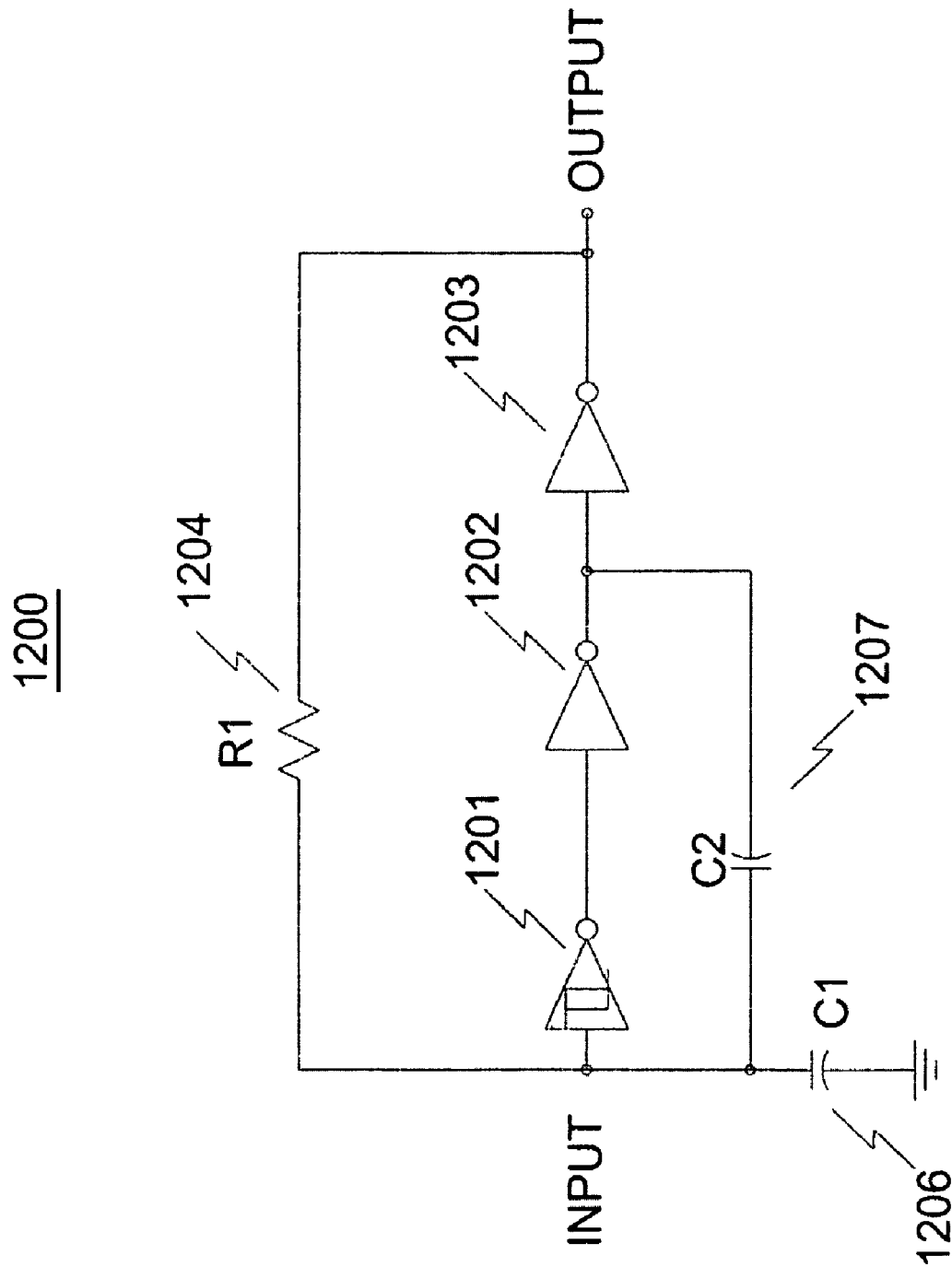
FIG. 12 is one embodiment of the sensor oscillator 1103 in FIG. 11.
Figure 13:
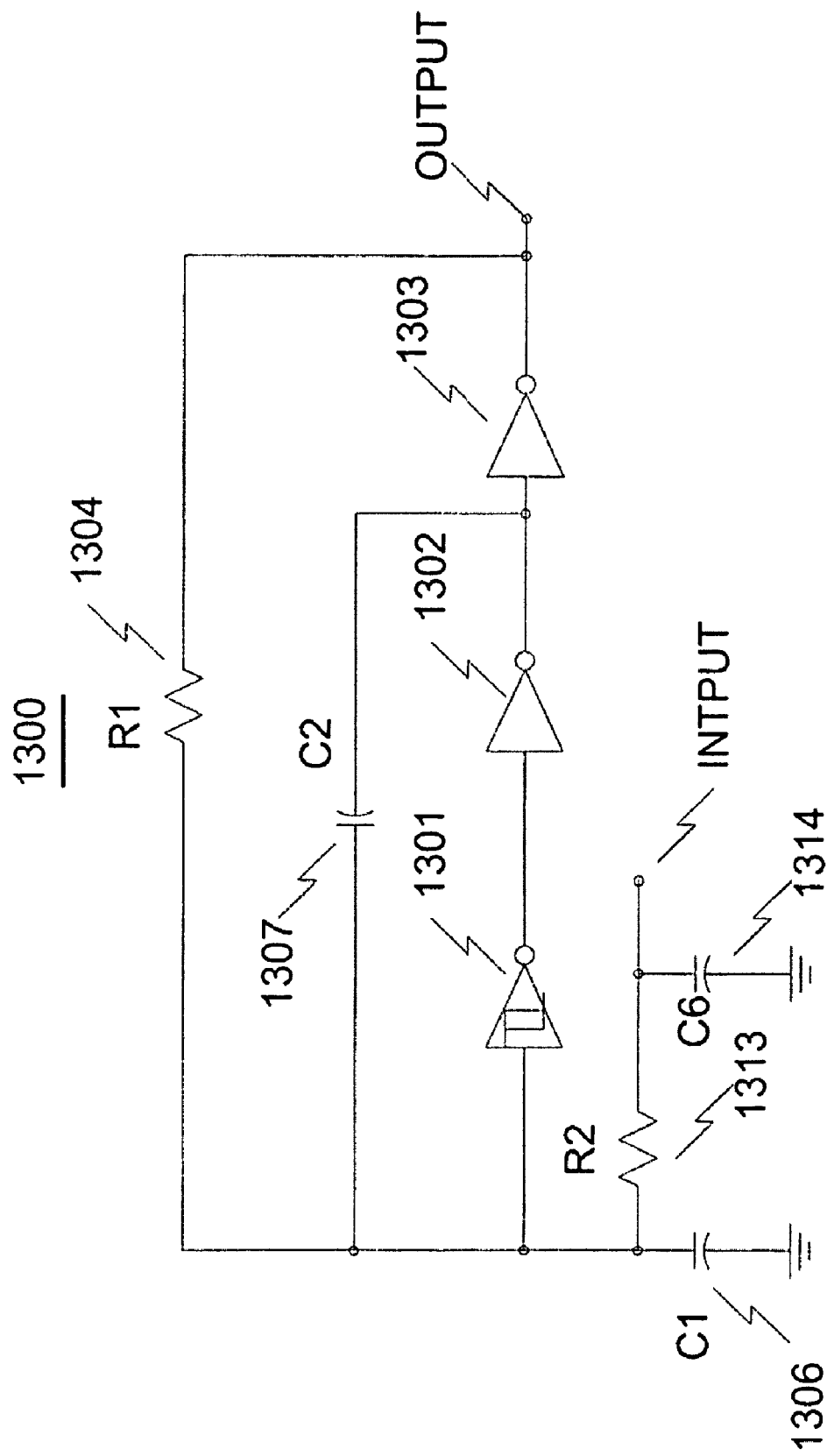
FIG. 13 is one embodiment of the sensor oscillator 1103 in FIG. 11.
Figure 14:
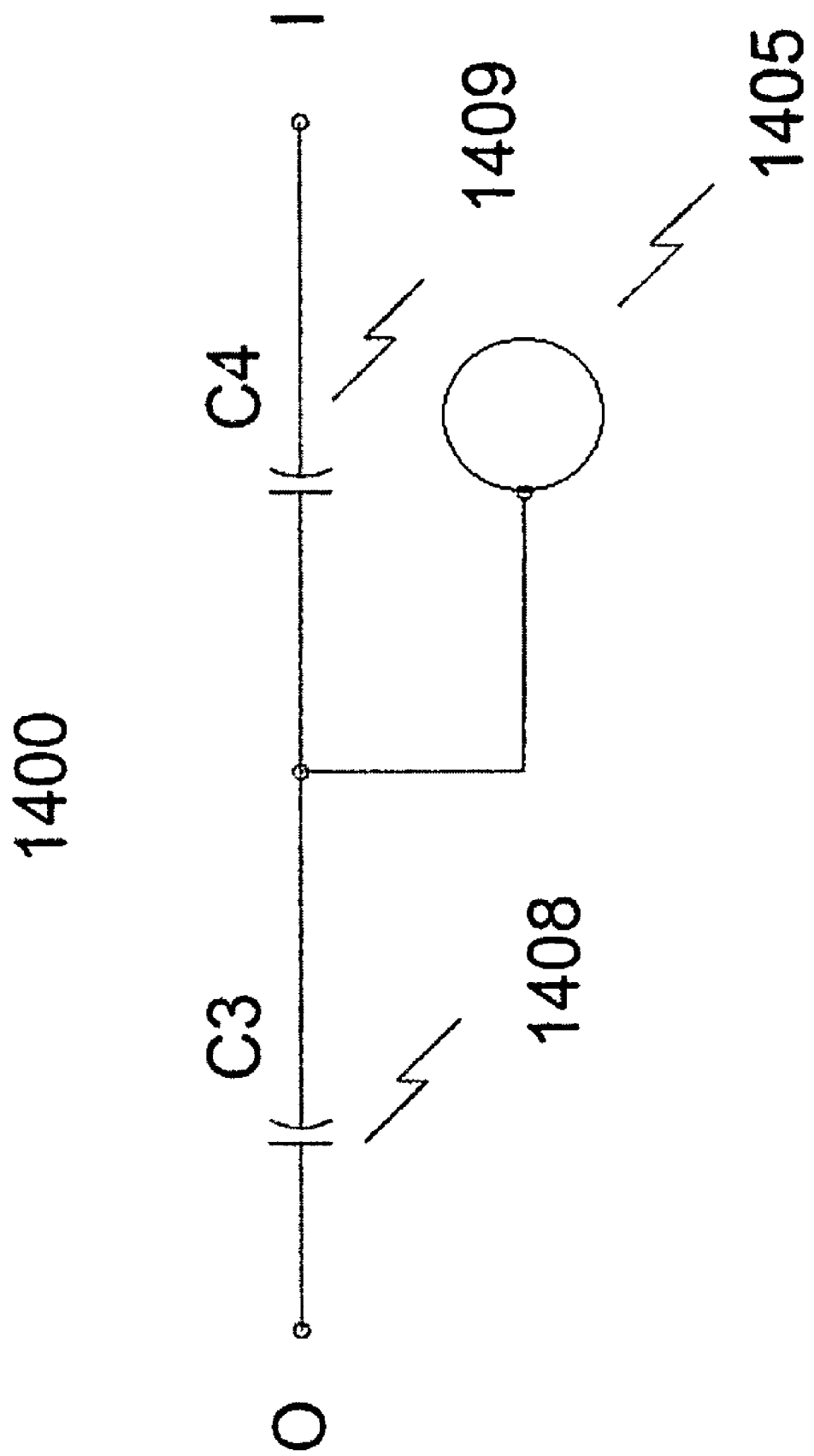
FIG. 14 is a sensor circuit with sensor plate.
Figure 15:
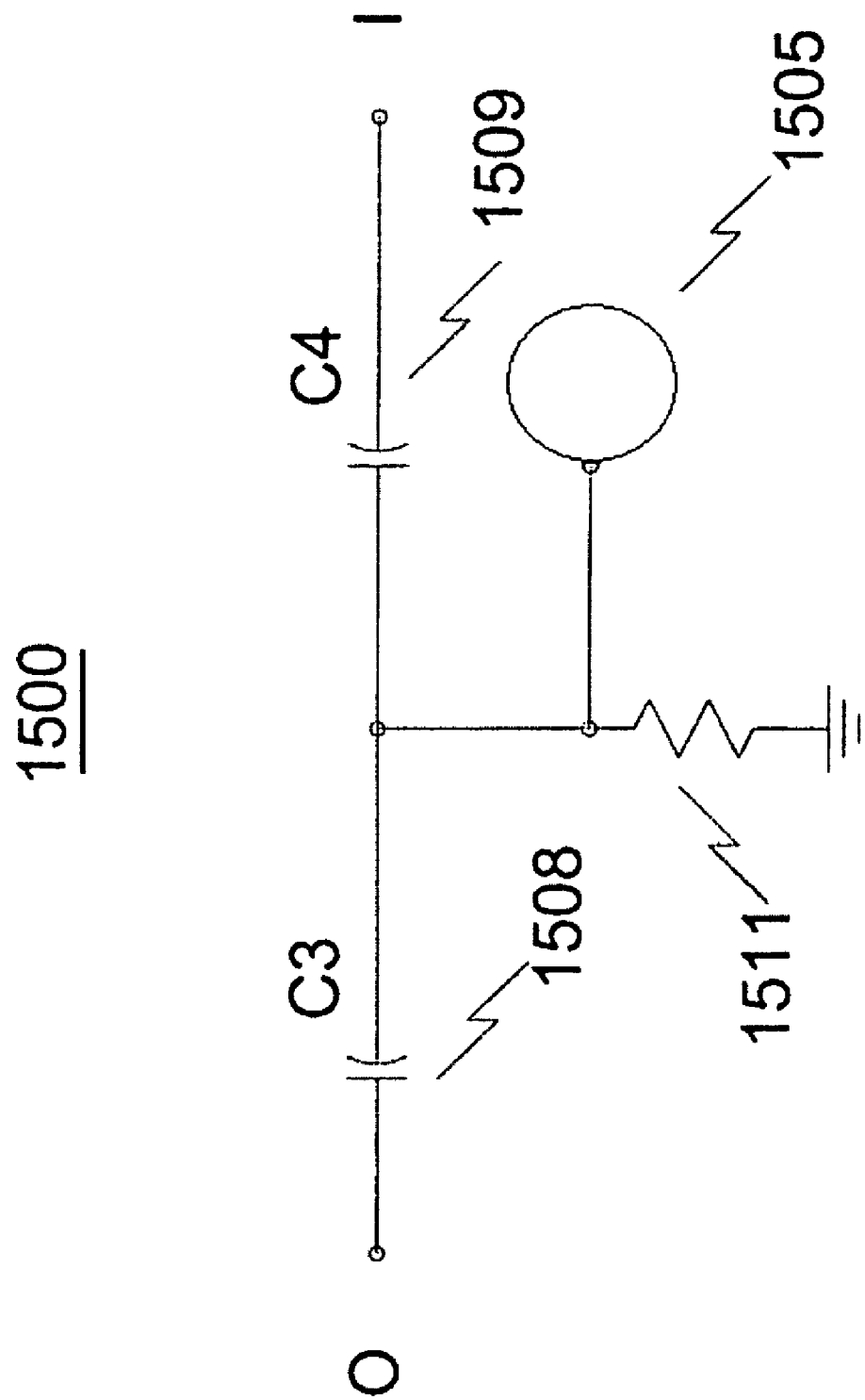
FIG. 15 is a sensor circuit with sensor plate.

FIG. 11 is one embodiment of an object position detector. In this circuit, the sensor oscillator 1103 is an oscillator as described in FIG. 3, FIG. 5, FIG. 7 or FIG. 9, but without the sensor circuit built in the oscillator. The circuits of the sensor oscillator 1103 are shown in FIG. 12 and FIG. 13. The sensor circuits with sensor plate are shown in FIG. 14 and FIG. 15. The circuit in FIG. 12 can be combined with circuit in FIG. 14 to form a sensor oscillator as described in FIG. 3. The circuit in FIG. 12 can be combined with circuit in FIG. 15 to form a sensor oscillator as described in FIG. 5. The circuit in FIG. 13 can be combined with circuit in FIG. 14 to form a sensor oscillator as described in FIG. 7. The circuit in FIG. 13 can be combined with circuit in FIG. 15 to form a sensor oscillator as described in FIG. 9. In FIG. 11, there are M transmission gates (1161 to 116M) connected in parallel at input 1101 of the sensor oscillator 1103 and N transmission gates (1181 to 118N) connected in parallel at the output 1102 of the sensor oscillator 1103. Two arrays of transmission gates can be used to form an M×N sensor matrix. To form a sensor element (11 to M1, 12 to M2 and 1N to MN) of the sensor matrix, we can connect the output of the sensor circuit to one of the M transmission gates (1161 to 116M) and connect the input of the sensor circuit to one of the N transmission gates (1181 to 118N). The control gates (CNTR1 to CNTRN and CNTC1 to CNTCM) of these transmission gates (1181 to 118N and 1161 to 116M) are connected to the outputs of a microprocessor 1106, and are scanned sequentially by the microprocessor 1106. A predetermined number (Nr) can be input to the microprocessor 1106 and used to define the sensitivity of each sensor element form by the sensor circuit. The reference count, N0, of each sensor element can be updated during the scanning of the matrix. If (N0−Nx)>Nr is measured during the scanning of the matrix, we can determine that an object is in proximity to that sensor element of the matrix.

As the size of sensor plate is not very large, the capacitance of the sensor plate is very small as compare to that of capacitors (1408, 1409) in FIG. 14 and capacitors (1508, 1509) in FIG. 15. In this condition the size of the sensor plate has little effect on the frequency of the sensor oscillator. And different size of sensor plate can be used in the object position detector.

Keep the conducting wire far from the ground of the circuit, the capacitance between the conducting wire and ground is much small than that of capacitors in sensor circuit in FIG. 14 and FIG. 15. In this situation the effect of the conducting wire on the frequency of sensor oscillator is small, and the conducting wire can be flexible without cause error detection of the object proximity detector.

In order to reduce the low frequency electromagnetic interference, the sensor oscillator in FIG. 12 and sensor circuit in FIG. 15 can be used in the object proximity detector in FIG. 11. For the reduction of high frequency electromagnetic interference, the sensor oscillator in FIG. 13 and sensor circuit 14 can be used in FIG. 11. To reduce both high frequency and low frequency electromagnetic interference, the sensor oscillator in FIG. 13 and the sensor circuit in FIG. 15 can be used in FIG. 11.

Although specific embodiments of the invention have disclosed, it will be understood by those having skill in the art that minor changes can be made to the form and details of the specific embodiments disclosed herein, without departing from the scope of the invention. The embodiments presented above are for purposes of example only and are not to be taken to limit the scope of the appended claims.

What is claimed is:

1. An object proximity detector, consisting of a sensor plate connected to a sensor oscillator, sensing proximity of an object by the variation of the capacitance; a sensor oscillator, the variation of the capacitance changes the frequency of said sensor oscillator, the output of said sensor oscillator is connected to the input of a counter; a counter, counting the frequency of said sensor oscillator, the output of said counter is communicated with a microprocessor; a time base oscillator, providing system clock to a microprocessor; a microprocessor, counting and processing the frequency count from said counter to determine that an object is in proximity of said object proximity detector; wherein the improvement comprising:
    said sensor oscillator consists of three inverters, a first inverter, a second inverter and a third inverter are in cascaded; a first capacitor is connected between the input of said first inverter and the ground; two capacitors in series are connected between the input of said first inverter and the output of said third inverter; a sensor plate connected at the junction of said two capacitors; a compensating capacitor connected between the input of said first inverter and the output of said second inverter; a feedback resistor connected between the input of said first inverter and the output of said third inverter; said feedback resistor is used to charge and discharge said capacitors in the oscillator circuit, said compensating capacitor is used to reduce the dependence of oscillator frequency on the process parameters, said two capacitors in series and said sensor plate is used to reduce the dependence of oscillator frequency on the area of sensor plate and to keep the flexibility of the connecting wire of said sensor plate.

2. An object proximity detector as recited in claim 1, further comprising:
    a resistor connected at the junction of said two capacitors and said sensor plate; said resistor and the capacitor between the object and said sensor plate form a high pass filter; said high pass filter is used to reduce low frequency electromagnetic interference.

3. An object proximity detector as recited in claim 1, further comprising:
    a resistor connected between the input of said first inverter and one terminal of said two capacitors in series, a capacitor connected between the ground and the junction of said resistor and one of the terminals of said two capacitors; said capacitor and the capacitor between the object and sensor plate form a voltage divider, said resistor and said first capacitor form a low pass filter; said voltage divider and said low pass filter are used to reduce the high frequency electromagnetic interference.

4. An object proximity detector as recited in claim 1, further comprising:
    A: a resistor connected at the junction of said two capacitors and said sensor plate; said resistor and the capacitor between the object and said sensor plate form a high pass filter; said high pass filter is used to reduce low frequency electromagnetic interference;
    B: a resistor connected between the input of said first inverter and one terminal of said two capacitors in series, a capacitor connected between the ground and the junction of said resistor and one of the terminals of said two capacitors; said capacitor and the capacitor between the object and sensor plate form a voltage divider, said resistor and said first capacitor form a low pass filter; said voltage divider and said low pass filter are used to reduce the high frequency electromagnetic interference.

5. An object position detector, consisting of a sensor oscillator; a time base oscillator, providing system clock to a microprocessor; a counter, counting the frequency of said sensor oscillator; a column of transmission gate connected to the input of said sensor oscillator; a row of transmission gate connected to the output of said sensor oscillator; said column of transmission gate and said row of transmission form a sensor matrix; each element of said sensor matrix is a sensor element consists of two capacitors connected in series and a sensor plate; said sensor plate is connected at the junction of said two capacitors; one terminal of said sensor element is connected to the input of said sensor oscillator through the output of said column transmission gate, and the other terminal of said sensor element is connected to the output of said sensor oscillator through output of said row transmission gate; the control inputs of said transmission gates are scanned by a microprocessor; a microprocessor, calculating and processing the frequency count from said counter to determine one or multiple objects are in proximity to which sensor plates of said sensor matrix; to determine the position of one or multiple objects in said sensor matrix; wherein the improvement comprising:
    said sensor oscillator consists of three inverters, a first inverter, a second inverter and a third inverter are in cascaded; a first capacitor is connected between the input of said first inverter and the ground; a compensating capacitor connected between the input of said first inverter and the output of said second inverter; a feedback resistor connected between the input of said first inverter and the output of said third inverter; said feedback resistor is used to charge and discharge said capacitors in the oscillator circuit, said compensating capacitor is used to reduce the dependence of oscillator frequency on the process parameters;
    said sensor element consists of two capacitors connected in series and connected between the input of said first inverter and the output of said third inverter through said column and row transmission gates respectively;
        the construction of said capacitors and sensor plate in said sensor element is used to reduce the dependence of oscillator frequency on the area of sensor plate, to keep the flexibility of the connecting wire of said sensor plate and keep uniform sensitivity for each sensor element in said object position detector.

6. An object position detector as recited in claim 5, further comprising:
   a resistor with one terminal connected at the junction of said two capacitors and said sensor plate and the other terminal connected to the ground in said sensor element; said resistor and the capacitor between the object and said sensor plate form a high pass filter; said high pass filter is used to reduce low frequency electromagnetic interference.

7. An object position detector as recited in claim 5, further comprising:
   a resistor connected between the input of said first inverter and the input of said column transmission gates; a capacitor connected between the input of said column transmission gates and the ground; said capacitor and the capacitor between the object and sensor plate form a voltage divider, said resistor and said first capacitor form a low pass filter; said voltage divider and said low pass filter are used to reduce the high frequency electromagnetic interference.

8. An object position detector as recited in claim 5, further comprising:
   A: a resistor with one terminal connected at the junction of said two capacitors and said sensor plate and the other terminal connected to the ground in said sensor element; said resistor and the capacitor between the object and said sensor plate form a high pass filter; said high pass filter is used to reduce low frequency electromagnetic interference;
   B: a resistor connected between the input of said first inverter and the input of said column transmission gates; a capacitor connected between the input of said column transmission gates and the ground; said capacitor and the capacitor between the object and sensor plate form a voltage divider, said resistor and said first capacitor form a low pass filter; said voltage divider and said low pass filter are used to reduce the high frequency electromagnetic interference.

* * * * *